(12) United States Patent
Isa et al.

(10) Patent No.: US 6,977,832 B2
(45) Date of Patent: Dec. 20, 2005

(54) SEMICONDUCTOR MEMORY DEVICE CAPABLE OF IMPROVING QUALITY OF VOLTAGE WAVEFORM GIVEN IN A SIGNAL INTERCONNECTION LAYER

(75) Inventors: Satoshi Isa, Tokyo (JP); Yoji Nishio, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 393 days.

(21) Appl. No.: 10/329,293

(22) Filed: Dec. 24, 2002

(65) Prior Publication Data

US 2003/0223284 A1 Dec. 4, 2003

(30) Foreign Application Priority Data

Dec. 26, 2001 (JP) .............................. 2001-393363

(51) Int. Cl.[7] .............................................. G11C 5/02
(52) U.S. Cl. ........................... 365/51; 365/63; 365/226
(58) Field of Search ............................. 365/51, 52, 63, 365/226, 233, 189.09, 189.11; 361/783, 788

(56) References Cited

U.S. PATENT DOCUMENTS

| | | | | |
|---|---|---|---|---|
| 6,438,012 B1 * | 8/2002 | Osaka et al. | ................... | 365/52 |
| 6,654,270 B2 * | 11/2003 | Osaka et al. | ................... | 365/51 |
| 6,690,612 B2 * | 2/2004 | Gall et al. | ................... | 365/226 |
| 6,697,420 B1 * | 2/2004 | Simon et al. | ................... | 375/220 |
| 6,771,515 B2 * | 8/2004 | McCall et al. | ............... | 361/788 |
| 6,777,262 B2 * | 8/2004 | Miyaki et al. | ............... | 438/106 |
| 6,846,738 B2 * | 1/2005 | Forbes et al. | ............... | 438/624 |
| 6,847,617 B2 * | 1/2005 | Borkar et al. | ............... | 370/258 |

FOREIGN PATENT DOCUMENTS

| | | |
|---|---|---|
| JP | 05-135826 | 6/1993 |
| JP | 09-214076 | 8/1997 |
| JP | 11-068313 | 3/1999 |
| JP | 2001-183422 | 7/2001 |

OTHER PUBLICATIONS

Japanese Office Action dated Jun. 16, 2004.
Japanese Office Action with Translation dated Nov. 4, 2004.

* cited by examiner

Primary Examiner—Gene N. Auduong
(74) Attorney, Agent, or Firm—Katten Muchin Rosenman LLP

(57) ABSTRACT

In a multilayer interconnection layer of a mother board and a memory module, a position relationship between a bus interconnection layer and a conductive layer of a power supply layer or a ground layer opposite to the bus interconnection layer is substantially held in not only the mother board but also the memory module and a relationship of multilayer interconnections is unified. As a result, it is possible to reduce disturbance of a return current of a high frequency signal given to the bus interconnection layer, to prevent degradation of quality of a signal waveform caused by the disturbance of the return current, and to prevent unnecessary electromagnetic waves from radiating caused by the disturbance of the return current. When a position relationship between the bus interconnection layer and an opposite conductive layer is not held at a constant, a similar effect is obtained by disposing a bypass capacitor in the vicinity of a portion where a plane of the bus interconnection layer and the conductive layer is switched.

25 Claims, 11 Drawing Sheets

SEMICONDUCTOR MEMORY DEVICE CAPABLE OF IMPROVING QUALITY OF VOLTAGE WAVEFORM GIVEN IN A SIGNAL INTERCONNECTION LAYER

BACKGROUND OF THE INVENTION

This invention relates to a memory bus transmission system for use in a semiconductor memory device or the like and, in particular, to a semiconductor memory device comprising a memory controller and a memory device mounted on a mother board and a memory bus transmission system therefor.

In general, the semiconductor memory device of the type described comprises a mother board and a memory module mounted on the mother board through a connector. In this event, a memory controller is mounted on the mother board and a plurality of memories are mounted on the memory module. The memory controller and the memory module are electrically connected to each other through signal interconnections given with high frequency signals such as a reference clock interconnections, data connections, and so on and are also electrically connected to each other through a ground interconnection and a power supply interconnection. In the semiconductor memory device of the form described, a driver having a push-pull structure is provided in the device of each of the memories and the memory controller. This driver is connected between the ground interconnection and the power supply interconnection and is connected to other devices through a signal interconnection having a bus structure through which data are inputted and outputted.

The mother board and the memory module described above have a multilayer interconnection structure where the above-mentioned each interconnection is formed in a shape of an interconnection layer. The interconnection layers of both of the mother board and the memory module are electrically connected to each other through pins provided in the connector and the interconnection layers comprises a memory transmission system.

On the other hand, with demand of a high speed for the memory device in recent years, in the semiconductor memory device using such a memory transmission system, to operate at a high frequency of several hundreds of megahertz or more is required.

However, when the semiconductor memory device is operated at the high frequency of several hundreds of megahertz or more, various problems occurred which are no problem in a case of operating at a low frequency. For instance, in a case where operation is carried out at the above-mentioned high frequency, when a voltage given in the signal interconnection layer composing the multilayer interconnection layer is observed at both of the driver of the output side and the memory controller of the input side, it was observed that an input voltage waveform is largely disturbed for an output voltage waveform. That is, it was known in the semiconductor memory device comprising the above-mentioned memory transmission system that the voltage waveform of the signal is largely disturbed when the signal having the high frequency is outputted on the signal interconnection and degradation of a signal quality occurs.

The co-inventors further studied the above-mentioned degradation of the voltage waveform of the signal in detailed. It was known that also a waveform of a return current flowing in the ground layer or the power supply layer is largely disturbed. It was understood that, by controlling the disturbance of a current waveform in such as a return current, that it is possible to improve quality of the voltage waveform of the signal in the signal interconnection and it is possible to control unnecessary electromagnetic wave radiation.

On the basis of the above-mentioned knowledge, the present co-inventors studied about a cause of the disturbance of the current waveform in the ground layer and the power supply layer caused by the disturbance of the signal voltage waveform. As a result, the present co-inventors cleared up that the cause of the disturbance of the current waveform is based on a difference of structure between the multilayer interconnection layer in the mother board and the multilayer interconnection layer in the memory module. In other words, it was understood that the disturbance of the current waveform occurs a reference clock interconnection, a data interconnection, and a signal interconnection operating at a high frequency similar to that in their interconnections among signal interconnections electrically connecting between the memory controller on the mother board and the memories on the memory module so that conductive layers opposite to each signal interconnection are not unified at a section between the mother board and the memory module.

Furthermore, in a conventional semiconductor memory device, two interconnections excepting for the signal interconnections closest to each signal interconnection at the section of the connector often have different potentials to the opposite conductive layers. When such interconnections are carried out at the connector section, in a high frequency of several hundreds of megahertz or more, a phenomenon so that the return current flows locally in the vicinity of directly under the bus interconnection in the opposite layer disposed under the bus interconnection occurs.

However, in a case where opposite layers of the bus in the memory module and the mother board are different from each other, it was understood that disturbance occurs in a flow of the return current and degradation happens in a transmission signal of the bus caused by this.

The above-mentioned point will be made described in more detailed. There is a case where position relationships are different between the multilayer interconnection structure on the mother board including the conductive layer opposite to the signal interconnection layer and the multilayer interconnection structure on the memory module. For example, the ground layer is disposed as the opposite layer of the signal interconnection layer on the mother board while the power supply layer is disposed as the opposite layer of the signal interconnection layer on the memory module.

When the conductive layer opposite to the signal interconnection layer changes from the ground layer to the power supply layer or from the power supply layer to the ground layer in the manner which is described above, it was understood that a phenomenon so that disturbances occur in a waveform of the return current flowing in the conductive layer caused by an impedance mismatching or the like is found and the disturbances of the waveform of the return current have a bad influence for quality of a voltage waveform of the signal in the signal interconnection layer.

SUMMARY OF THE INVENTION

It is therefore an object of the present invention to provide a semiconductor memory device which is capable of improving a quality of a voltage waveform given in a signal interconnection layer.

It is another object of the present invention to provide a semiconductor memory device of the type described, which is capable of improving the quality of a signal by preventing disturbances of a waveform of a return current flowing in at least one of a power supply layer and a ground layer.

It is still another object of the present invention to provide a semiconductor memory device of the type described, which is capable of improving an unnecessary electromagnetic wave from radiating by improving the waveform of the return current.

It is yet another object of the present invention to provide a memory transmission system which decreases disturbances of a current waveform and disturbances of a signal current waveform by improving multilayer interconnection structures in a mother board and in a memory module.

It is a further object of the present invention to provide a semiconductor memory device comprising a connector which is capable of decreasing disturbances of a current waveform by improving a pin arrangement.

Other objects of this invention will become clear as the description proceeds.

According to a first aspect of this invention, a memory device comprises a memory module disposing a plurality of memories for inputting and outputting data therein, a mother board for mounting the memory module by a connector therein, a memory controller mounted on the mother board, and drivers mounted in the memories and the memory controller. Each of the drivers has a push-pull structure. The memory module comprises a module multilayer interconnection layer including a module driver power supply layer, a module ground layer, and a module signal interconnection layer for transmitting a high frequency signal. The mother board comprises a board multilayer interconnection layer including a board driver power supply layer, a board ground layer, and a board signal interconnection layer for transmitting a high frequency signal. A board position relationship between at least one of the board driver power supply layer and the board ground layer and the board signal interconnection layer in the board multilayer interconnection layer of the board mother board is substantially held also in a module position relationship between at least one of the module driver power supply layer and the module ground layer and the module signal interconnection layer in the module multilayer interconnection layer of the memory module. It is therefore possible to reduce disturbances of a return current flowing in the board and the module driver power supply layers and in the board and the module ground layers and degradation of the high frequency signal.

In a memory device according to the first aspect of this invention, the board position relationship and the module position relationship may be opposite to each other in the board and the module multilayer interconnection layers.

In a memory device according to the first aspect of this invention, both of the board and the module driver power supply layers and the board and the module ground layers may be put into a predetermined position relationship for the board and the module signal interconnection layers in both of the board and the module multilayer interconnection layers of the mother board and the memory module.

In a memory device according to the first aspect of this invention, the connector may comprise ground pins electrically connected to ground interconnections of the board and the module ground layers, driver power supply pins electrically connected to power supply interconnections of the board and the module driver power supply layers, and a plurality of high frequency signal pins electrically connected to signal interconnections of the board and the module signal interconnection layers. At least ones of the ground pins and the driver power supply pins may be disposed in the vicinity of periphery of the high frequency signal pins.

In a memory device according to the first aspect of this invention, the connector may comprise ground pins electrically connected to ground interconnections of the board and the module ground layers, driver power supply pins electrically connected to power supply interconnections of the board and the module driver power supply layers, and a plurality of high frequency signal pins electrically connected to signal interconnections of the board and the module signal interconnection layers. The connector may include two pins in the vicinity of one of the high frequency signal pins. One of the two pins is the ground pin while another of the two pins is the driver power supply pin.

According to a second aspect of this invention, a memory bus transmission system comprises a plurality of memories in which data are inputted and outputted, a plurality of memory modules on which the memories are disposed, a memory controller for controlling the plurality of memories, a mother board on which the memory controller is disposed, and drivers mounted in the memories and the memory controller. Each of the drivers has a push-pull structure. The memory bus transmission system comprises a plurality of signal interconnections for electrically connecting the memory controller and the memories. The signal interconnections includes a plurality of high frequency signal interconnections operating at a high frequency, a driver power supply layer, and a ground layer. The high frequency signal interconnections are put into an opposite position relationship to at least one of the driver power supply layer and the ground layer at a section of the mother board and the memory module. The opposite position relationship is substantially identical at the section of the mother board and the memory module.

In a memory bus transmission system according to the second aspect of this invention, the high frequency signal interconnections may be substantially wired at a section of the mother board and the memory module so as to oppose to the ground layer.

In a memory bus transmission system according to the second aspect of this invention, the high frequency signal interconnections may be substantially wired at a section of the mother board and the memory module so as to oppose to both of the ground layer and the driver power supply layer.

In a memory bus transmission system according to the second aspect of this invention, a part of the high frequency signal interconnections may be substantially wired at a section of the mother board and the memory module so as to oppose to the ground layer. The remaining of the high frequency signal interconnections may be substantially wired at a section of the mother board and the memory module so as to oppose to the ground layer and the driver power supply layer.

In a memory bus transmission system according to the second aspect of this invention, a part of said high frequency signal interconnections may be substantially wired at a section of the mother board and the memory module so as to oppose to the ground layer. The remaining of the high frequency signal interconnections may be substantially wired at the section of the mother board and the memory module so as to oppose to both of the ground layer and the driver power supply layer.

According to a third aspect of this invention, a memory bus transmission system comprises a memory module disposing a plurality of memories thereon that date are inputted and outputted, a mother board mounting a memory controller for controlling the plurality of memories thereon, a connector for electrically connecting the memory module and the mother board, drivers mounted in the memories and the memory controller, each of the drivers having a push-pull structure, and a bus interconnection layer for connecting the driver and the memory controller. A bypass capacitor is disposed on the mother board adjacent to the connector at a predetermined position, thereby bypassing a return current from the bus interconnection layer by the bypass capacitor.

In a memory bus transmission system according to the third aspect of this invention, the predetermined position of the bypass capacitor may be disposed in the vicinity of a position where the bus interconnection layer switches to another layer at a multilayer interconnection layer in the mother board and the memory module.

According to a fourth aspect of this invention, a memory module mounts a plurality of memories on both surfaces that input and output data. The memory module comprises a multilayer interconnection structure. The memory module comprises a first high frequency interconnection layer for the memories disposed at a side of one surface of the both surface, a ground layer, opposite to the first high frequency interconnection layer, disposed at a side of one surface of the both surface, a second high frequency interconnection layer for the memories disposed at a side of another surface of the both surface, and a power supply layer, opposite to the second high frequency interconnection layer, disposed at a side of another surface of the both surface.

DESCRIPTION OF THE PREFERRED EMBODIMENTS

Figure 1:
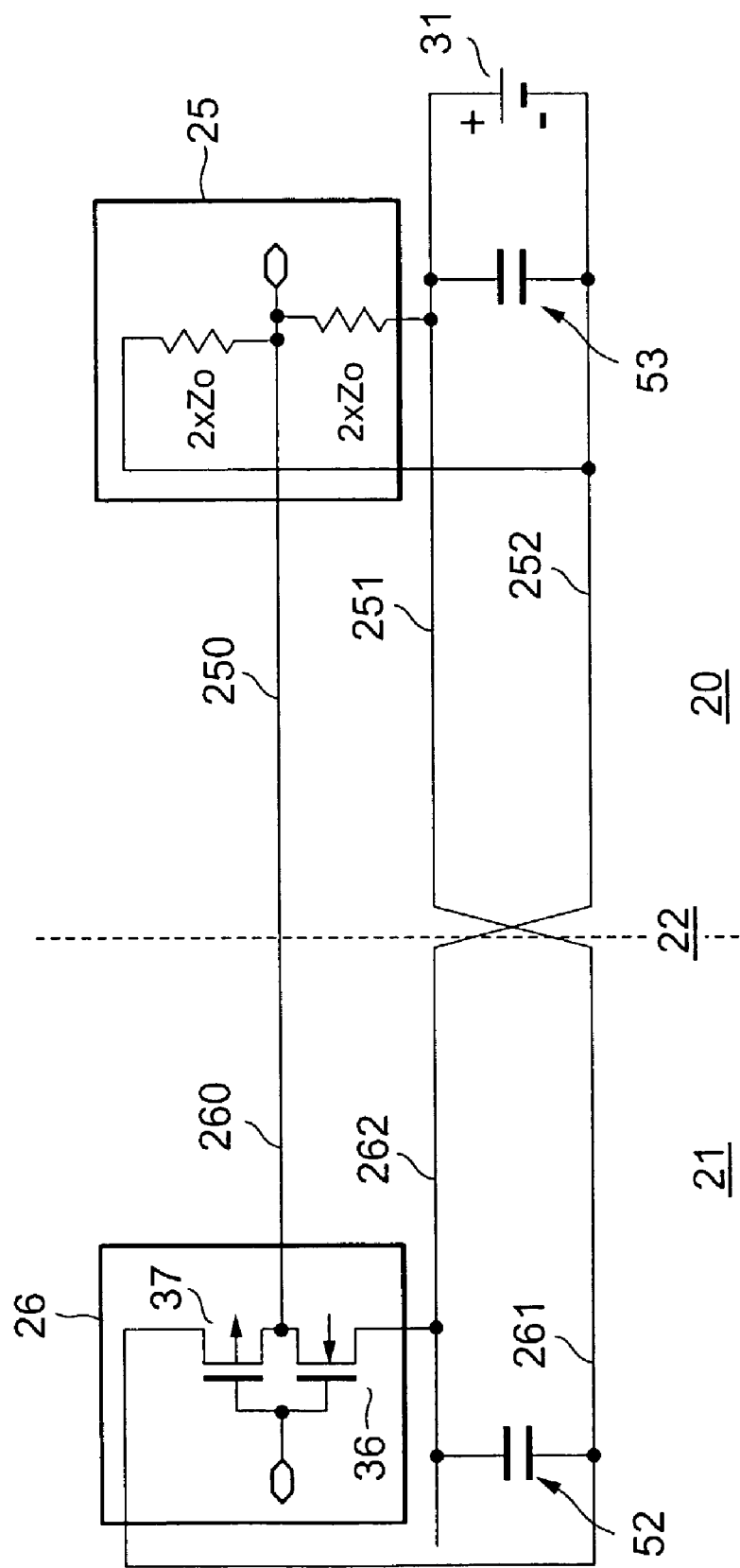
FIG. 1 is a view for use in describing a bus transmission structure in a known semiconductor memory device.

Referring to FIG. 1, a conventional semiconductor memory device will be described at first in order to facilitate an understanding of the present invention. FIG. 1 is a view for use in describing a bus transmission structure in the conventional memory device.

The illustrated semiconductor memory device comprises a mother board 20 and a memory module 21 mounted on the mother board 20. On each of the mother board 20 and the memory module 21, board and module multilayer interconnection are subjected. The board multilayer interconnections of the mother board 20 and the module multilayer interconnections of the memory module 21 are electrically connected to each other through a connector 22. On the mother board 20, a memory controller 25 is mounted. On the memory module 21, a memory device is mounted. In the example being illustrated, although illustration is made in a case where a single memory device 26 is mounted on the memory module 21 in order to simplify the description, a plurality of memory devices may be mounted on the memory module 21. In addition, the memory device 26 and the memory controller 25 are connected to each other through bus interconnections, such as a clock bus, a data bus, and so on that transmit a clock signal, data, and so on at a high frequency which is less than several hundreds of megahertz.

Only a part related to this invention is illustrated herein. On this relationship, in this figure, in the memory device 26, only a driver circuit comprising an N-channel MOS transistor 36 and a P-channel MOS transistor 37 which are connected in a push-pull fashion and other parts such as a receiver circuit and so on are omitted. Likewise, in this figure, in an input circuit which comprises a part of the memory controller 25 and which comprises an input buffer and a terminating circuit, only the terminating circuit comprising two resistors connected in series to a power supply 31 is characterized as the memory controller 25. The illustrated input circuit (the terminating circuit) of the memory controller 25 comprises two resistors which are connected in series and each of which has an impedance of 2×Zo. A bus interconnection is connected to a common node of both resistors. Zo is a characteristic impedance of the bus interconnection.

Referring further to FIG. 1, the illustrated board multilayer interconnections of the mother board 20 comprise a board bus interconnection layer 250 comprising board bus interconnections, a board driver power supply layer 251, and a board ground layer 252. Although the board mutilayer interconnections really include more interconnection layers such as other power supply layers supplied with a potential different from that of the driver power supply layer, in order to simplify the description herein, only the board bus interconnection layer 250, the board driver power supply layer 251, and the board ground layer 252 will be described. As is apparent from this figure, the terminating circuit is connected between the board driver power supply layer 251 and the board ground layer 252. Between the board driver power supply layer 251 and the board ground layer 252 in the vicinity of the memory controller 25, a board bypass capacitor 53 having a capacitance of about 0.1 $\mu$F is connected.

On the other hand, the module multilayer interconnections of the memory module 21 comprise a module bus interconnection layer 260, a module driver power supply layer 261, and a module ground layer 262. Although the module multilayer interconnections of the memory module 21 really include a low frequency interconnection layer and so on which are not illustrated, they are omitted herein. The illustrated driver of push-pull structure in the memory device 26 is connected to the memory controller 25 through the module bus interconnection layer 260 and is also connected to the module driver power supply layer 261 and the module ground layer 262. In addition, a memory bypass capacitor 52 having a capacitance of 0.1 μF is connected in the vicinity of the memory device 26.

Between the illustrated board and module driver power supply layers 251 and 261 and the board and module ground layers 252 and 262, the power supply 31 is connected. From the power supply 31, a driver power supply voltage (VDDQ) is supplied. The driver supply voltage (VDDQ) may be equal to or may be different from a power supply voltage (VDD) which is necessary to operate an internal circuit of the device. When the power supply voltage (VDD) different from the driver power supply voltage (VDDQ) is supplied, the power supply layer for VDD and the power supply layer for supplying VDDQ are mounted on planes (regions) which are different from each other. When the driver power supply voltage (VDDQ) is equal to the power supply voltage (VDD), a common interconnection layer may be used.

In the manner as is illustrated, the board bus interconnection layer 250 of the mother board 20 is opposite to the board driver power supply layer 251 and is not opposite to the board ground layer 252. On the other hand, the module bus interconnection layer 260 of the memory module 21 is opposite to the module ground layer 262 and is not directly opposite to the module driver power supply layer 261. In other words, a board position relationship between the board driver power supply layer 251 and the board ground layer 252 in the board multilayer interconnection layer of the mother board 20 is different from a module position relationship between the module driver power supply layer 261 and the module ground layer 262 in the module multilayer interconnection layer of the memory module 21. On the figure, the board and the module position relationships of both layers are inverted in structure to each other.

In a case where conductive layers opposite to the board and the module bus interconnection layers 250 and 260 change between the side of the mother board 20 and the side of the memory module 21 in the manner which is described above, when data or a clock signal is transmitted at a high speed of several hundreds of megahertz, disturbances occur in a voltage waveform of a signal on the board and the module bus interconnection layers 250 and 260. As a result, it was known that it is impossible to carry out an accurate signal transmission.

The present co-inventors studied about a cause of the above-mentioned disturbances of the voltage waveform. When a signal having a high frequency more than several hundreds of megahertz is transmitted and received through the board and the module bus interconnection layers 260 and 250, disturbances occur in a return current (a ground current or a power supply current) flowing through the driver power supply layer or the ground layer. As a result, it was known that quality of the voltage waveform in the signal is degraded. Accordingly, it is necessary to reduce the above-mentioned disturbances in the current in order to prevent the quality in the voltage waveform of the signal from reducing.

Figure 2:
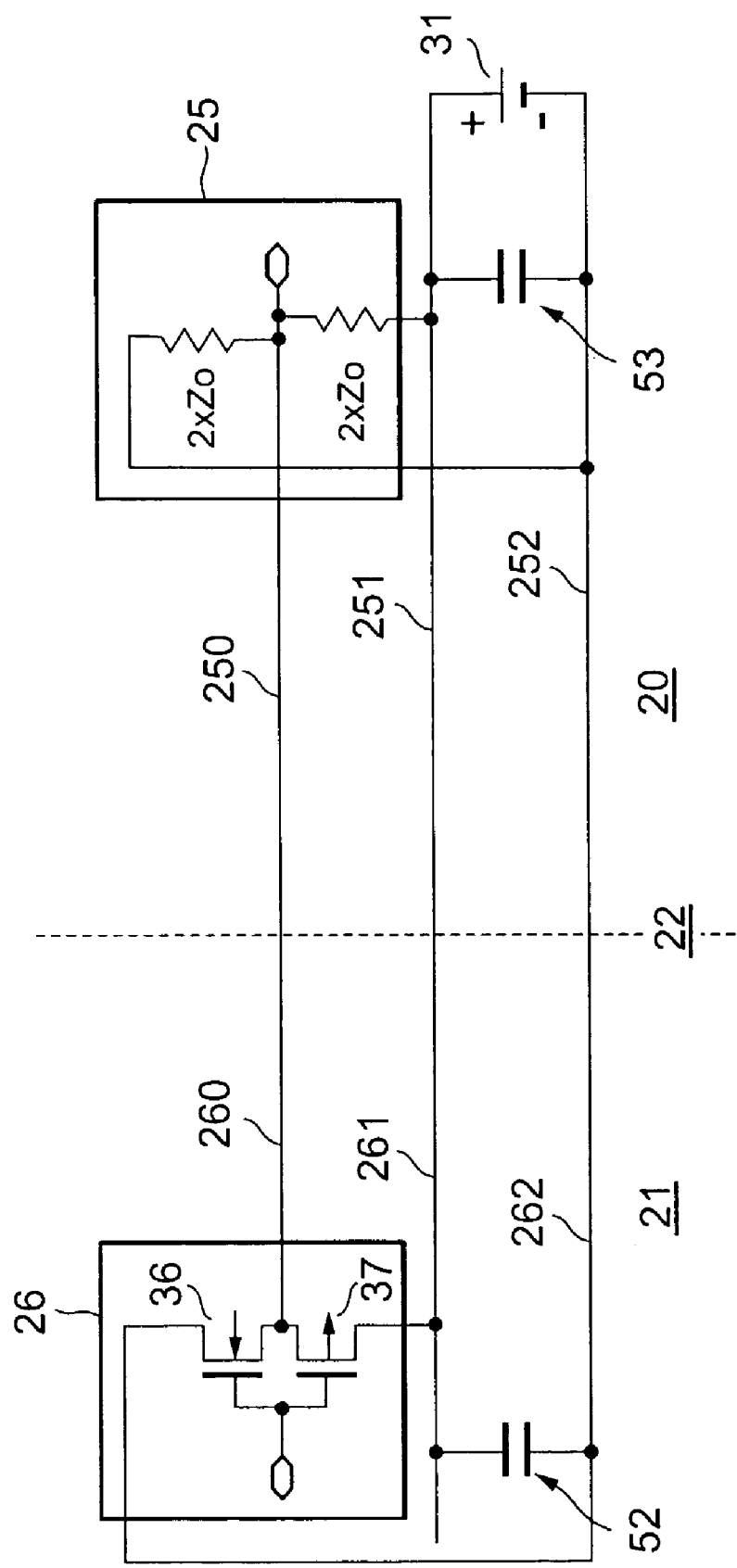
FIG. 2 is a view for use in describing a bus transmission system of a semiconductor memory device according to an embodiment of this invention.

Referring to FIG. 2, a semiconductor memory device according to an embodiment of this invention is illustrated. In FIG. 2, the same reference symbols are attached to parts corresponding to those of FIG. 1. As is apparent from FIG. 2, the semiconductor memory device comprises the mother board 20 and the memory module 21. The board multilayer interconnection layers of the mother board 20 are characterized by the board bus interconnection layer 250, the board driver power supply layer 251, and the board ground layer 252. The module mutilayer interconnection layers of the memory module 21 are characterized by the module bus interconnection layer 260, the module driver power supply layer 261, and the module ground layer 262. In addition, the mother board 20 and the memory module 21 are electrically connected to each other through the connector 22. Furthermore, in the manner which is similar to FIG. 1, the board bypass capacitor 53 having the capacitance of about 0.1 μF is connected between the board driver power supply layer 251 and the board ground layer 252 in the vicinity of the memory controller 25 while the memory bypass capacitor 52 having the capacitance of about 0.1 μF is connected between the module driver power supply layer 261 and the module ground layer 262 in the vicinity of the memory device 26.

In the manner as illustrated in FIG. 2, the board driver power supply layer 251 given with the driver power supply potential VDDQ from the power supply 31 is disposed as the conductive layer opposite to the board bus interconnection layer 250 of the mother board 20 while the module driver power supply layer 261 is disposed as the conductive layer opposite to the module bus interconnection layer 260 of the memory module 21. In the example being illustrated, the board ground layer 252 of the mother board 20 and the module ground layer 262 of the memory module 21 are placed in a similar position relationship in the multilayer connection layers. Accordingly, with this structure, a board relationship between the board bus interconnection layer 250 and the board driver power supply layer 251 in the mother board 20 is similar to a module relationship between the module bus interconnection layer 260 and the module driver power supply layer 261 in the memory module 21. This means that the bus interconnection layer and the driver power supply layer are unified in both of mother board 20 and the memory module 21. In other words, the multilayer interconnection structure of the mother board 20 and the memory module 21 illustrated in FIG. 2 has structure so as to avoid inverting the driver power supply layer and the ground layer to each other, as illustrated in FIG. 1.

In a case of the example being illustrated, the board and the module driver power supply layers 251 and 261 are uniformly used as the conductive layers opposite to the board and the module bus interconnection layers 250 and 260 in the mother board 20 and the memory module 21. In addition, a driver circuit of a push-pull structure is provided with a side of the memory module 21. The driver circuit comprises the N-channel MOS transistor 36 and the P-channel MOS transistor 37. The P-channel MOS transistor 37 is connected to the module driver power supply layer 261 while the N-channel MOS transistor 36 is connected to the module ground layer 262.

Figure 3:
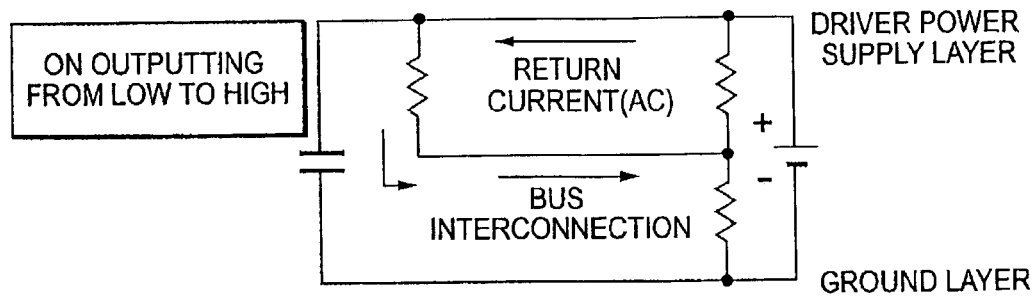
FIG. 3 is a schematic circuit diagram for use in describing an operating state in the bus transmission system illustrated in FIG. 2.

Operation of the semiconductor memory device illustrated in FIG. 2 will be described with reference to also an equivalent circuit illustrated in FIGS. 3 and 4. FIG. 3 shows operation of a case where a signal for converting a high level to a low level is supplied to gates of the N-channel MOS transistor 36 and the P-channel MOS transistor 37 composing the driver circuit of the memory device 26 and then the N-channel MOS transistor 36 is turned off and the P-channel MOS transistor is turned on. That is, FIG. 3 shows a case where the driver power supply potential VDDQ is given to the board and the module bus interconnection layers 260 and 250 through the P-channel MOS transistor 37 from the board and the module driver power supply layers 251 and 261 by putting the P-channel MOS transistor 37 into an on state and a state of the bus interconnection layers is shifted from a low state to a high state. When a potential of the board and the module bus interconnection layers 260 and 250 is shifted from a low level to a high level in the manner which is described above, a power supply current from the power supply 31 flows in the memory controller 25 through the P-channel MOS transistor 37 put into an on state and the board and the module bus interconnection layers 260 and 250 as a signal current. On the other hand, during when the P-channel MOS transistor 37 is put into an on state, an AC current from the power supply 31 flows in the board and the module driver power supply layers 251 and 261 as a return current, as illustrated in FIG. 3.

On the other hand, when the gates of the P-channel MOS transistor 37 and the N-channel MOS transistor 36 are supplied with a signal for converting from a low level to a high level, the P-channel MOS transistor 37 is put into an off state and the N-channel MOS transistor 36 is put into an on state. As a result, a potential of the module and the board bus interconnection layers 260 and 250 shifts from a high level to a low level, a signal current flows from the memory controller side to the memory module side through the module and the board bus interconnection layers 260 and 260 as shown in FIG. 4, and an AC current flows from the memory module side to the memory controller side through the memory bypass capacitor 52 and the module and the board driver power supply layers 261 and 251.

Figure 4:
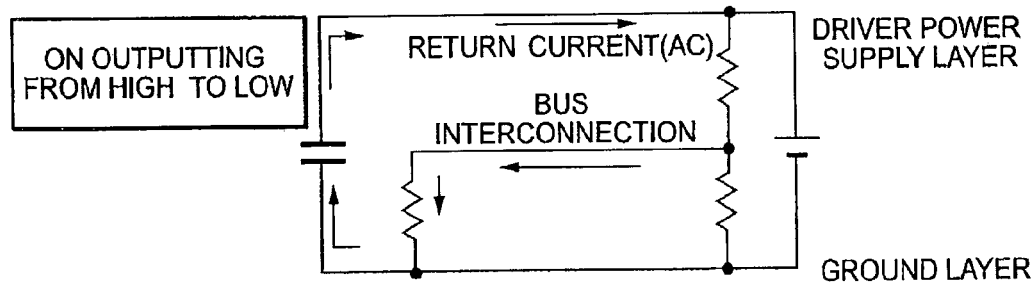
FIG. 4 is a schematic circuit diagram for use in describing another operating state in the bus transmission system illustrated in FIG. 2.

In the manner as is apparent from FIGS. 3 and 4, inasmuch as the board and the module driver power supply layers 251, 261 as the opposite conductive layers of the board and the module bus interconnection layers 250 and 260 continue between the memory module 26 and the memory controller 25, it is possible to prevent reflection of the return current and ringing.

Figure 5:
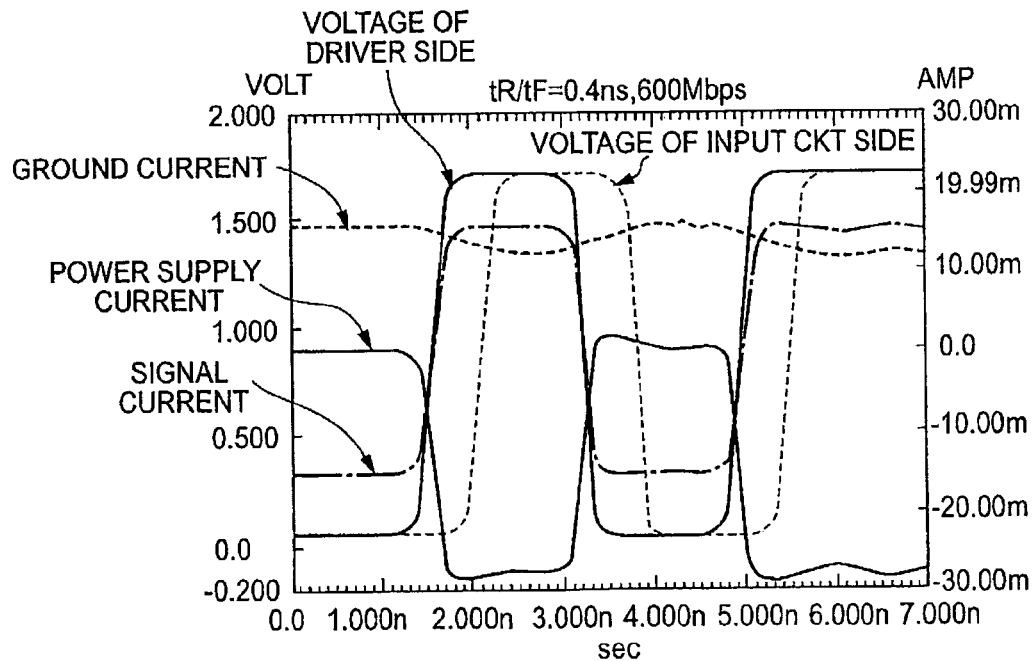
FIG. 5 is a view showing characteristic of the bus transmission system illustrated in FIG. 2.

Really, FIG. 5 shows a characteristic in a case where a signal having tR/tF (rise time/fall time) of 0.4 ns and having a bit rate of 600 Mbps is given to the semiconductor memory device illustrated in FIG. 2 from the driver circuit of the memory device 26. FIG. 5 shows a voltage waveform of the driver side of a signal interconnection in the bus interconnection layers and a voltage waveform of the input circuit side of the memory controller (see a left-hand side scale). FIG. 5 also shows a ground current, a power supply current, and a signal current following variations of the voltage waveform of the driver side and variations of the voltage waveform of the input side in the signal interconnection (see a right-hand side scale).

In the manner as is apparent from FIG. 5, although a voltage of the driver side changes drastically, the ground current flowing in the ground layer is substantially constant and the power supply current flowing in the driver power supply layer changes very smoothly. Therefore, distortions of a waveform caused by the disturbance of the ground current and the power supply current do not occur in the voltage of the driver side and the voltage of the input circuit side. Accordingly, it was in this invention confirmed that it is possible to hold the voltage waveform of the signal on the bus interconnection layer at a high quality and a high bus transmission is available.

Figure 6:
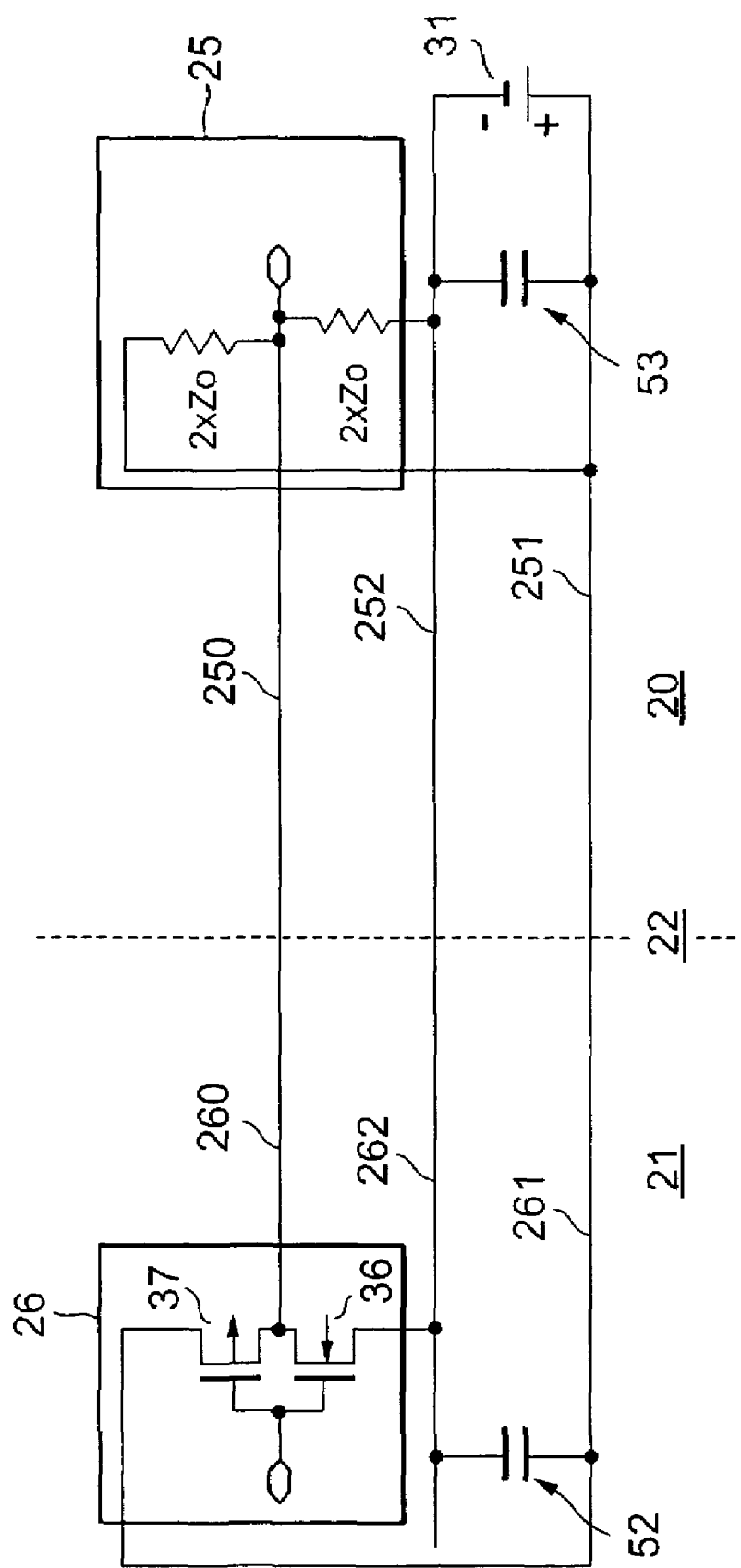
FIG. 6 is a view for use in describing a bus transmission system of a semiconductor memory device according to another embodiment of this invention.

Referring to FIG. 6, a semiconductor memory device according to another embodiment of this invention is illustrated. FIG. 6 shows a structure where the board ground layer 252 is disposed as the conductive layer opposite to the board bus interconnection layer 250 of the mother board 20 and the board ground layer 252 is continued as also the module ground layer 262 of the memory module 21. That is, FIG. 6 shows the semiconductor memory device having the structure where the module and the board driver power supply layers 261, 251 and the module and the board ground layers 262, 252 illustrated in FIG. 2 are changed to each other. Inasmuch as the board and the module ground layers 252, 262 are used as the conductive layers opposite to the board and the module bus interconnection layers 250, 260 in FIG. 6, the driver circuit of the memory module 21 side is similar in structure to that illustrated in FIG. 1.

By replacing the conductive layers opposite to the module and the board bus interconnection layers 260, 250 with the board and the module ground layers 252, 262 in the manner which is described above, a merit similar to that in FIG. 5 is obtained.

By unifying the conductive layers opposite to the bus interconnections operable at the high frequency so as to substantially dispose the same arrangement at sections of the mother board 20 and the memory module 21 as illustrated in FIGS. 2 and 6, it is possible to reduce degradation of the quality of the signal waveform caused by reflection of the signal and by the ringing. Although FIGS. 2 and 6 illustrate so that the board and the module bus interconnection layers 250 and 260 are opposite to both of the board and the module ground layers 252, 262, and the board and the module driver power supply layers 251, 261, only the layers near to the board and the module bus interconnection layers 250, 260 among the board and the module ground layers 252, 262 or the board and the module driver power supply layers 251, 261 may be disposed so as to oppose to the board and the module bus interconnection layers 250, 260 extending both of the mother board 20 and the memory module 21. In other words, the board and the module ground layers 252, 262 or the board and the module driver power supply layers 251, 261 which are apart from the board and the module bus interconnection layers 250, 260 may be changed layer positions of the multilayer interconnection layers in the mother board 20 and the memory module 21.

Furthermore, the effect that the board and the module bus interconnection layers 250, 260 and the conductive layers are opposite to each other means that an interconnection area of the board and the module bus interconnection layers 250, 260 is included in an interconnection area of the conductive layers or overlaps each other seen from the top. Accordingly, when the board and the module bus interconnection layers 250, 260 have a width, the conductive layers having a width wider than that of the board and the module bus interconnection layers 250, 260 may be disposed on under layers of the board and the module bus interconnection layers 250, 260 with they overlapped each other seen from the top. This is similar in other embodiments which will later be described.

In FIGS. 2 and 6, the description was made about a case where a relationship between the bus interconnection layers and the opposite conductive layers are continued extending the whole of the mother board 20 and the memory module 21 and unified. However, it is really necessary to electrically connect the bus interconnection layers, the ground layers, the driver power supply layers, and so on with pins of the connector 22 at portions adjacent to the connector 22 illustrated in FIGS. 2 and 6 among the mother board 20 and the memory module 21. In this event, at very short portions adjacent to the connector 22, a relationship between the bus interconnection layers and the opposite conductive layers may be not always put into a unified state as illustrated in FIGS. 2 and 6. However, the present co-inventors confirmed that the effect shown in FIG. 5 is obtained in a case where a position relationship between the bus interconnection layers and the opposite conductive layers changes a little in the very short portions such as the connector 22.

Accordingly, it is understood in this invention that the above-mentioned opposite relationship between the bus interconnection layers and the opposite conductive layers may be substantially continued extending to the mother board 20 and the memory module 21 and may be unified. In addition, this invention will make clear, by taking into account an arrangement of the pins in the connector 22, a structure which is capable of further reducing adverse effect caused by lack of unity in an adjacent portion of the connector 22.

Figure 7A:
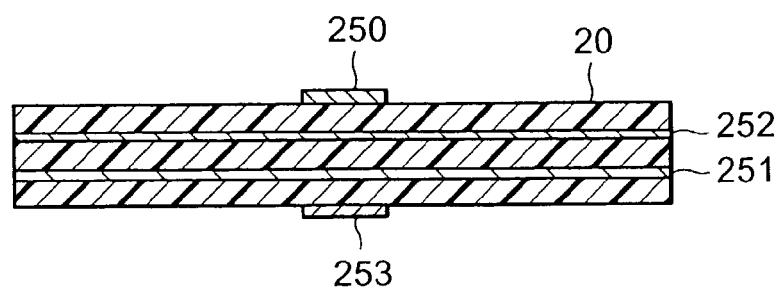
FIGS. 7A, 7B, and 7C are views for use in describing interconnection structure of each portion illustrated in FIG. 6 in more detailed.
Figure 7B:
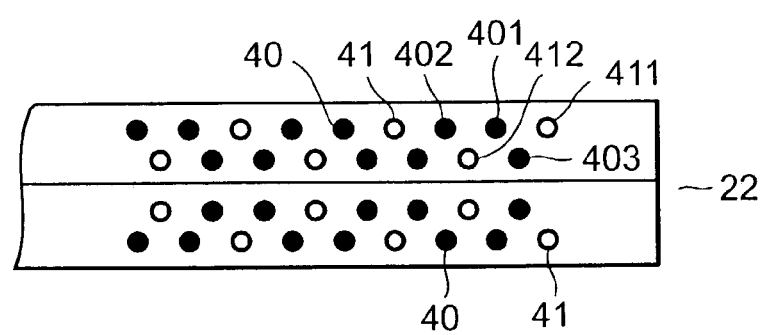
Figure 7C:
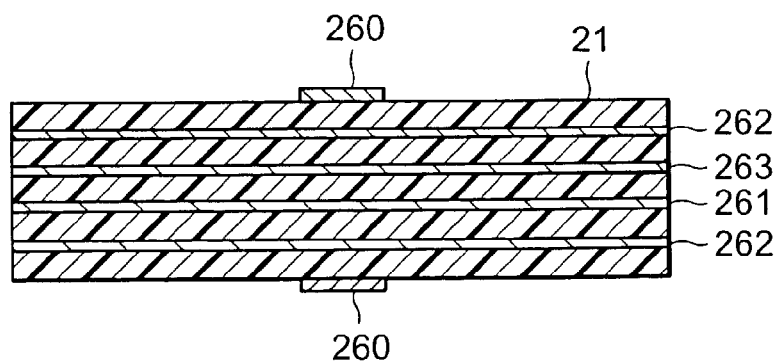

FIGS. 7A, 7B, and 7C are views showing an interconnection (wiring) structure and a pin arrangement of the connector of a semiconductor memory device according to still another embodiment of this invention. FIG. 7A shows the multilayer interconnection structure of the mother board 20, FIG. 7B shows the pin arrangement of the connector 22, and FIG. 7C shows the multilayer interconnection structure of the memory module 21. In the example being illustrated, the multilayer interconnection structures of the mother board 20 and the memory module 21 dispose the ground layers as the conductive layers opposed to the bus interconnection layers.

The multilayer interconnection structure of the mother board 20 illustrated in FIG. 7A has a four-layer structure and comprises the high frequency interconnection layer as the board bus interconnection layer 250 at a most upper layer. The illustrated board bus interconnection layer 250 extends in a perpendicular to a paper sheet of FIG. 7A. The board bus interconnection layer 250 is called herein a first layer. Under the board bus interconnection layer 250, the board ground layer 252 as the conductive layer opposite to the board bus interconnection layer 250 is disposed as a second layer. The board ground layer 252 is given with a ground potential (Vss). In this event, the board ground layer 252 may be disposed directly under the board bus interconnection layer 250 so as to include an area of the board bus interconnection layer 250 seen the board bus interconnection layer 250 from the top. It is not necessary to form the board ground layer 252 extending in overall of the mother board 20 as illustrated. At any rate, the board bus interconnection layer 250 may be disposed so as to become a state opposite to the board ground layer 252 in the mother board 20.

Furthermore, under the board ground layer 252 as the second layer, a third layer is disposed. Although the board driver power supply layer 251 given with the driver power supply VDDQ is disposed in the illustrated third layer, a device power supply layer is also disposed in the third layer when there is the board device power supply layer given with a device power supply VDD. When the board device power supply layer as well as the board driver power supply layer 251 are disposed in the manner which is described above, both power supply layers are disposed in the third layer with an area divided. When the device power supply VDD and the driver power supply VDDQ are equal to each other, the board driver power supply layer 251 is used as the board device power supply layer. When the driver power supply voltage VDDQ and the device power supply voltage VDD are different from each other, the board device power supply layer may be disposed on the same plane of the board driver power supply layer 251 or may be disposed in a new different layer. In the manner which is described above, the third layer includes a plurality of types of interconnection layers, it is not necessary for the board driver power supply layer 251 and the board device power supply layer disposed in the third layer to have a position relationship opposite to the board bus interconnection layer 250, the board ground layer 252 may have a position relationship opposite to the board bus interconnection layer 250. In addition, on the illustrated mother board 20, a low frequency interconnection layer 253 is disposed on a lower part of the driver power supply layer 251 as a fourth layer.

The board bus interconnection layer 250, the board ground layer 252, the board driver power supply layer 251, and the low frequency interconnection layer 253 illustrated in FIG. 7A are connected to pins of the connector 22 of FIG. 7B. With this relationship, each layer is led up to a position enable to connect to the pins of the connector 22 in a portion of the connector 22.

FIG. 7B shows a part of the connector 22 which can be connected to the mother board 20 illustrated in FIG. 7A. FIG. 7B shows the pin arrangement on viewing the connector 22 from the lower portion of the mother board 20. The illustrated connector 22 is usually fixed to the mother board 20 and has a structure so as to insert the memory module 21 into the connector 22. The illustrated connector 22 has the pin arrangement so as to electrically connect the memory module 21 and each pin is electrically connected to a lot of electrodes which are electrically connected to the multilayer interconnection layer provided in the memory module 21.

As is apparent from FIG. 7B, four rows of pins are disposed in a vertical direction of FIG. 7B. Among those, upper two rows of pins are pins which are electrically connected to each electrode led from the mother board 20. The upper two rows of pins are electrically connected to the electrodes led from one surface of the memory module 21. Similarly, lower two rows of pins connected to the electrodes of the mother board 20 are electrically connected to each electrode led from another surface of the memory module 21.

FIG. 7B shows only a pin portion related to the high frequency signal among a lot of pins provided in the connector 22. In FIG. 7B, pins 40 depicted at black circles are high frequency signal pins while pins 41 depicted at white circles are ground layer pins.

In the manner which is illustrated in FIG. 7B, the high frequency signal pins 40 are collectively disposed in a part of the connector 22 and only the ground layer pins 41 are disposed to adjacent positions of the high frequency signal pins 40. Attention will be directed to a high frequency signal pin 401 depicted at a black circle illustrated in FIG. 7B among the high frequency signal pins 40. Pins nearest to the high frequency signal pin 401 are four pins, namely, two high frequency signal pins 402 and 403 depicted at black circle and two ground layer pins 411 and 412 depicted at white circle. Excepting the pins 402 and 403 similar to the high frequency signal pin 401, the high frequency signal pin 401 is put into a state opposite to the two ground layer pins 411 and 412. It is understood that other high frequency signal pins 40 are similar to this. This means that the board position relationship between the board bus interconnection layer 250 and the board ground layer 252 illustrated in FIG. 2A is substantially held in the connector 22. In addition, pins of the connector 22 that are electrically connected to the baord driver power supply layer 251 and the low frequency interconnection layer 253 illustrated in FIG. 7A are provided at positions apart from the high frequency signal pins 40 illustrated in FIG. 7B.

Now, FIG. 7C shows the multilayer interconnection structure of the memory module 21. The illustrated multilayer interconnection structure has a six-layer structure. On a first layer of an upper surface side and a sixth layer of a lower surface side, the module bus interconnection layers 260 are disposed, respectively. As a second layer and a fifth layer nearest to the module bus interconnection layers 260 comprising the first layer and the sixth layer, the module ground layers 262 are disposed, respectively. It is understood that the module bus interconnection layers 260 and the module ground layers 262 are laid in a adjacent position relationship.

In this event, the module ground layers 262 of the first and the fifth layers may cover at least occupied areas of the module bus interconnection layers 260. It is not necessary for the module ground layers 262 of the first and the fifth layers to form extending in overall of the memory module 21, as shown in FIG. 7C. In the manner which is described in conjunction with FIG. 7A, each module ground layer 262 may be disposed at a position opposite to the module bus interconnection layer 260 as to have a width wider than that of the module bus interconnection layer 260.

Furthermore, under the module ground layer 262 as the second layer of the memory module 21, a third layer including a module device power supply layer 263 for supplying the device power supply voltage VDD and a low frequency interconnection layer is disposed. In this event, the module device power supply layer 263 and the low frequency interconnection layer in the third layer are disposed in a form to divide an area of the memory module 21 each other. The module device power supply layer 263 and the low frequency interconnection layer may not be laid in a position relationship opposite to the module bus interconnection layer 260 and the module ground layer 262.

Under the third layer, a fourth layer including the module driver power supply layer 261 and a low frequency interconnection layer is disposed. The module driver power supply layer 261 and the low frequency interconnection layer is disposed with an area of the fourth layer divided. In the example being illustrated, inasmuch as the module ground layer 262 opposes to the module bus interconnection layer 260, it is not necessary for the module driver power supply layer 261 to dispose a position opposite to the module bus interconnection layer 260.

Under the fourth layer, the module ground layer 262 and the module bus interconnection layer 260 are disposed as the fifth and the sixth layers, respectively, in the manner which is described above. The module ground layer 262 and the module bus interconnection layer 260 are disposed so as to oppose to each other.

In the multilayer interconnection structure illustrated in FIG. 7C, the module device power supply layer 263 and the module driver power supply layer 261 for supplying the device power supply voltage (VDD) and the driver power supply voltage (VDDQ) are disposed in the first and the fourth layers which are different from each other. However, the module device power supply layer 263 and the module driver power supply layer 261 may be disposed in the same layer with an area divided in the manner as a case of the mother board 20 in FIG. 7A. In this event, the low frequency interconnection layer also may disposed in a single layer.

At any rate, it is possible to realize the effects according to this invention when the module bus interconnection layer 260 as the high frequency interconnection layer and the module ground layer 262 are laid in a position relationship opposite to each other in the memory module 21.

Electrodes in an end part of the memory module 21 are disposed so that the module bus interconnection layers 260 and the module ground layers 262 of the memory module 21 illustrated in FIG. 7C are electrically connected to the high frequency signal pins 40 and the ground layer pins 41 of the connector 22 illustrated in FIG. 7B.

With this structure, each electrode of the illustrated memory module 21 is electrically connected to each pin of the connector 22 mounted in perpendicular to a predetermined position of the mother board 20.

Figure 8A:
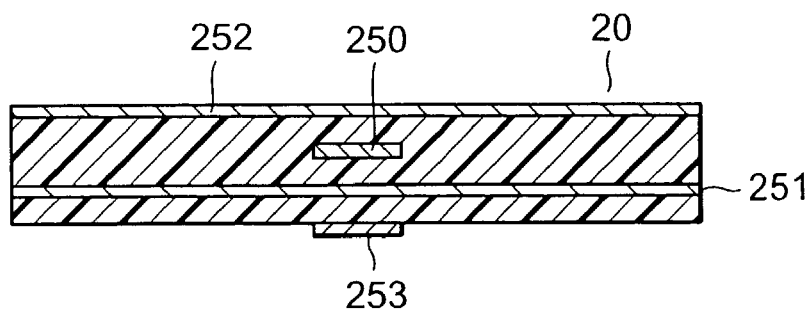
FIGS. 8A, 8B, and 8C are views for use in describing interconnection structure of each portion illustrated in FIG. 2 in more detailed.
Figure 8B:
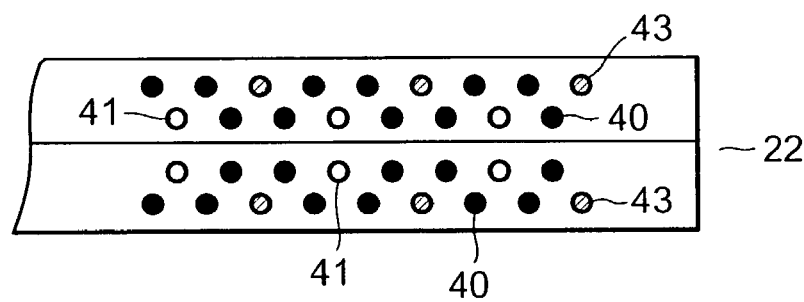
Figure 8C:
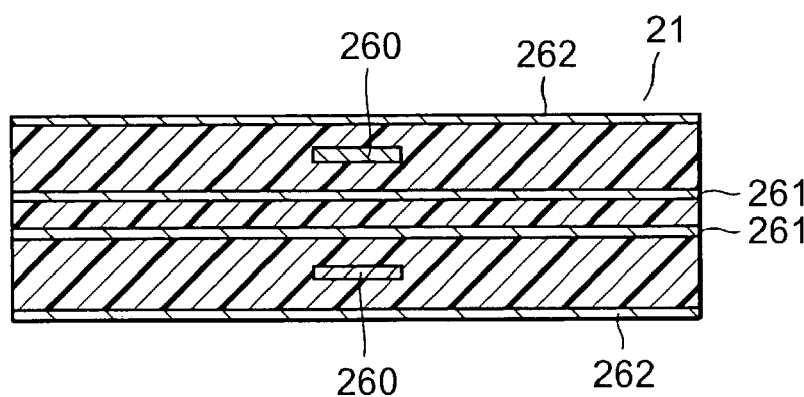

FIGS. 8A, 8B, and 8C are views showing an interconnection (wiring) structure and a pin arrangement of the connector of a semiconductor memory device according to yet another embodiment of this invention. FIG. 8A shows a multilayer interconnection structure of the mother board 20, FIG. 8B shows the pin arrangement of the connector 22, and FIG. 8C shows a multilayer interconnection structure of the memory module 21. In the example being illustrated, it is assumed that the mother board 20 and the memory module 21 have the multilayer interconnection layers where the board ground layer 252 and the bus board interconnection layer 250 are put into a position relationship opposite to each other.

The mother board 20 illustrated in FIG. 8A comprises the board ground layer 252 in the most upper layer (or, a first layer) and the board bus interconnection layer 250 for transmitting the high frequency signal as a second layer so as to oppose to the board ground layer 252. The board ground layer 252 disposed as the first layer may be disposed on only a portion opposite to the board bus interconnection layer 250 in the manner as the above-mentioned embodiments.

Furthermore, at a lower part of the board bus interconnection layer 250 in the illustrated mother board 20, the board driver power supply layer 251 for giving the driver power supply voltage VDDQ is disposed as a third layer. In the illustrated third layer, the board driver power supply layer 251 is included in a part thereof and the board device power supply layer for giving the device power supply voltage VDD is disposed in another area thereof. However, it is desirable that at least the board driver power supply layer 251 among interconnection layers composing the third layer is disposed in the lower part of the board bus interconnection layer 250. At a lower part of the third layer in the above-mentioned mother board 20, the low frequency interconnection layer 253 is disposed as a fourth layer. With this structure, the board bus interconnection layer 250 opposes to both of the board ground layer 252 and the board driver power supply layer 251 in the mother board 20.

Referring to FIG. 8C, the memory module 21 having a six-layer interconnection structure is illustrated as the multilayer interconnection structure. In the example being illustrated, the module ground layers 262 are disposed as a first layer and a sixth layer. In addition, at a lower part of the module ground layer 262 as the first layer, the module bus interconnection layer 260 is disposed as a second layer. Although that the module bus interconnection layers 260 are disposed so as to oppose to the module ground layers 262 is similar to the above-mentioned embodiment, other device power supply layers and so on are disposed at parts except for the module bus interconnection layer 260 in the second layer. In the similar manner as the second layer, the module bus interconnection layer 260 is disposed in the fifth layer at a part opposite to the module ground layer 262 of the sixth layer. In addition, device power supply layers and so on are disposed at parts except for the module bus interconnection layer 260 in the fifth layer.

Between the second and the fifth layers, two layers of module driver power supply layers 261 are disposed as third and fourth layers and each module driver power supply layer 261 is positioned so as to oppose to the module bus interconnection layer 260. In this event, in the third and the fourth layers, low frequency interconnection layers are disposed at parts which are not opposed to the module bus interconnection layer 260. In the manner which is described above, in the similar manner as the second and the fifth layers, a plurality of types of interconnection layers are disposed in the third and the fourth layers with areas divided.

In this embodiment, the module ground layers 262 opposite to the module bus interconnection layers 260 are disposed as the first and the sixth layers so as to cover parts where the module bus interconnection layers 260 occupy in plane.

In addition, each module bus interconnection layer 260 is wired so as to oppose to both of the module ground layer 260 and the module driver power supply layer 261 and it is understood that this structure is similar to a position relationship of a multilayer interconnection structure of the module ground layer 252, the module bus interconnection layer 250, and the module driver power supply layer 251 in the mother board 20 illustrated in FIG. 8A.

FIG. 8B shows a part of pin structure of the connector 22 fixed to the mother board 20 illustrated in FIG. 8A. FIG. 8B shows a case of viewing the connector 22 from a lower part of the mother board 20. Each interconnection layer of the mother board 20 illustrated in FIG. 8A is electrically connected to pins illustrated in FIG. 8B, electrodes are disposed at a end portion of the memory module 21 illustrated in FIG. 8C so as to electrically connect to the pins of FIG. 8B, and the memory module 20 is mounted on the mother board 20 by inserting it in the connector 22.

The connector 22 illustrated in FIG. 8B has high frequency signal pins 40 depicted at black circles and ground pins 41 depicted at white circles in the manner which is similar to the pin arrangement illustrated in FIG. 7B and has driver power supply pins 43 depicted at hatched circles.

As is apparent from this figure, it is understood that the high frequency signal pins 40 depicted at the black circles are disposed between the driver power supply pins 43 depicted at the hatched circles and the ground pins 41 depicted at the white circles. This means that, in pins adjacent to each high frequency signal pin 40 (that is, pins except for the high frequency signal pin 40), one is the driver power supply pin 43 and another is the ground pin 41. With this structure, it is confirmed that it is possible to reduce disturbances in a waveform of a high frequency signal which is transmitted and received via the bus interconnection layers 260.

Figure 9A:
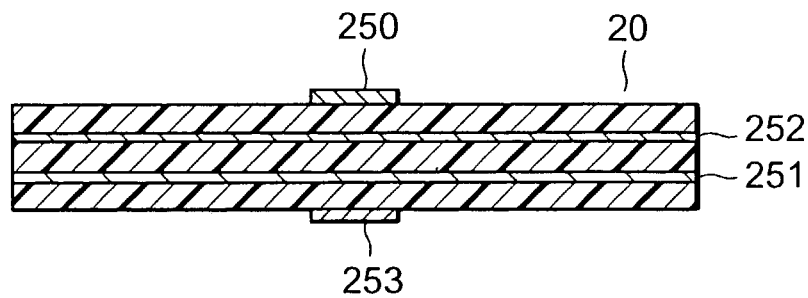
FIGS. 9A, 9B, and 9C are views for use in describing interconnection structure according to still another embodiment of this invention.
Figure 9B:
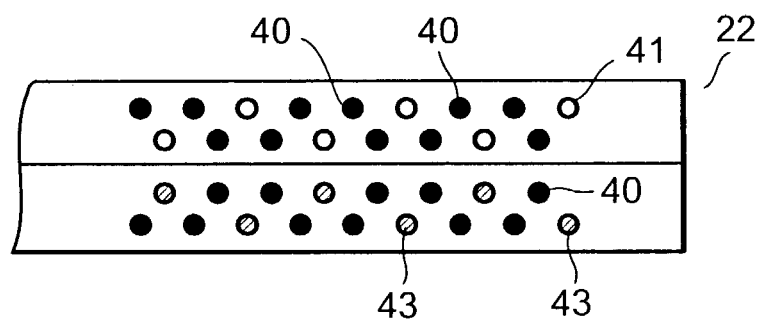
Figure 9C:
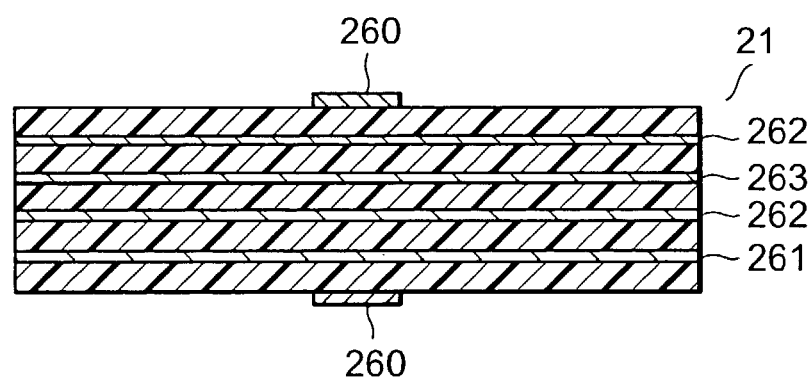

FIGS. 9A, 9B, and 9C are views showing an interconnection (wiring) structure and a pin arrangement of the connector of a semiconductor memory device according to a further embodiment of this invention. FIG. 9A shows a multilayer interconnection structure of the mother board 20, FIG. 9B shows the pin arrangement of the connector 22, and FIG. 9C shows a multilayer interconnection structure of the memory module 21. In the example being illustrated, the multilayer interconnection structure of the mother board 20 and the memory module 21 has structure where the board and the module ground layer 252 or 262 is disposed directly below the board and the module bus interconnection layer 250 or 260.

More specifically, the mother board 20 has a four-layer structure of the multilayer interconnection structure. The board bus interconnection layer 250 is disposed as a first layer. The low frequency interconnection layer (not shown) is disposed at parts except for a part where the board bus interconnection layer 250 is disposed. Under the board bus interconnection layer 250, the board ground layer 252 having a part opposite to the board bus interconnection layer 250 is disposed as a second layer. The board ground layer 252 may be disposed in only a part opposite to the board bus interconnection layer 250, namely, a part covered with the board bus interconnection layer 250 with a wider width than that of the board bus interconnection layer 250 by a degree.

Under the board ground layer 252, the board driver power supply layer 251 is disposed as a third layer and the illustrated board driver power supply layer 251 is disposed at least part covered with the baord bus interconnection layer 250. In addition, in the illustrated third layer, a board device power supply layer is disposed at a part except for the board driver power supply layer. In the manner which is described above, the illustrated third layer includes an area of the board driver power supply layer 251 and an area of the board device power supply layer.

In the example being illustrated, a fourth layer including the low frequency interconnection layer 253 and a high frequency interconnection layer (a bus interconnection layer) is disposed. At an area where the bus interconnection layer operable as the high frequency interconnection layer) is disposed in the forth layer, the board diver power supply layer 251 is disposed at the area of the third layer opposite to the bus interconnection layer in question and the board driver power supply layer 251 is disposed so as to oppose to the board ground layer 252 in the manner which is described above. As a result, the bus interconnection layer disposed in the fourth layer is also disposed at a position opposed to the board ground layer 251.

The memory module 21 illustrated in FIG. 9C has a six-layer interconnection layer and comprises the module bus interconnection layers 260 as first and sixth layers. Under the module bus interconnection layer 260 of the first layer, the module ground layer 262 is disposed as a second layer. In this event, the module ground layer 262 may be disposed so as to overlap with the module bus interconnection layer 260 of the first layer with a wider width than that of the module bus interconnection layer 260 by a degree and it is not necessary for the module ground layer 262 to dispose to all over the memory module 21. Under the module ground layer 262, a third layer is disposed, and the illustrated third layer includes the low frequency interconnection layer and the module device power supply layer. Over the module bus interconnection layer 260 of the sixth layer, the module driver power supply layer 261 is disposed as a sixth layer and an area of the module driver power supply layer 261 in question opposes to the module bus interconnection layer 260 of the sixth layer. In the example being illustrated, the low frequency interconnection layer is disposed in the fifth layer at an area except for the module driver power supply layer 261.

Over the module driver power supply layer 261 disposed as the fifth layer of the memory module 21, the module ground layer 262 is disposed. The illustrated module ground layer 262 is also disposed so as to the module driver power supply layer 261 of the fifth layer. With this structure, two module ground layers 262 are disposed so as to oppose to two module bus interconnection layers 260, respectively.

A position relationship of the above-mentioned module bus interconnection layers 260 and the module ground layers 262 is equivalent to the position relationship of each layer in the multilayer structure in the mother board illustrated in FIG. 9A.

The multilayer structure of FIG. 9C, it may be possible to adopt structure where the low frequency interconnection layer 263 as the third layer and the module ground layer 262 as the fourth layer are omitted.

The multilayer structure comprises the module bus interconnection layer 260 as the first layer, the module ground layer 262 as the second layer, the module driver power supply layer 261 as the fifth layer, and the module bus interconnection layer 260 as the sixth layer. In the manner which is described, the multilayer structure comprises the module bus interconnection layers 260 at both sides and the module ground layer 262 and the module driver power supply layer 261 as module conductive layers opposite to the respective module bus interconnection layer 260.

In other words, the module bus interconnection layers 260 are disposed both sides of the memory module 21, one of the layers opposite to the respective module bus interconnection layers 260 is the module ground layer 262, and another of the layers opposite to the respective module bus interconnection layers 260 is the module driver power supply layer 261. With this structure, by effectively using the module ground layer 262 of one layer and the module driver power supply layer 261 of one layer, it is possible to reduce degradation of a transmission signal without increasing the number of the layers in the memory module 21.

The connector 22, which electrically connects the mother board 20 and the memory module 21 illustrated in FIGS. 9A and 9C with each other, is used with the connector 22 fixed to the mother board 20 in the manner which is similar to other embodiments. The illustrated connector 22 has the pin arrangement which is different from each other in an upper half and a lower half as shown in FIG. 9C. That is, the pin arrangement illustrated in the upper half of FIG. 9C comprises the high frequency interconnection pins 40 depicted at black circles and the ground pins 41 depicted as white circles while the pin arrangement illustrated in the lower half of FIG. 9C comprises the high frequency interconnection pins 40 depicted at the block circle and the driver power supply pins 43 depicted at hatched circles.

Referring to the upper half of FIG. 9B, among the high frequency interconnection pins 40, the nearest one of pins except for the high frequency interconnection pins 40 in question is the ground pin 41 and it is understood that the high frequency interconnection pins 40 and the ground pins 41 are put into a position relationship where they are opposed to each other in the connector 22. On the other hand, in the lower half of FIG. 9B, the high frequency interconnection pins 40 and the driver power supply pins 43 are put into a position relationship where they are opposed to each other in the connector 22. Accordingly, the connector 22 illustrated in FIG. 9B can use to electrically connect the memory module 22 having the multilayer structure illustrated in FIG. 9C with the mother board 20 illustrated in FIG. 9A.

Figure 10A:
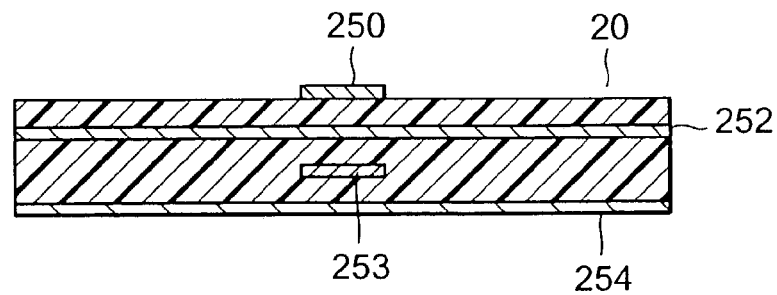
FIGS. 10A, 10B, and 10C are views for use in describing interconnection structure according to yet another embodiment of this invention.
Figure 10B:
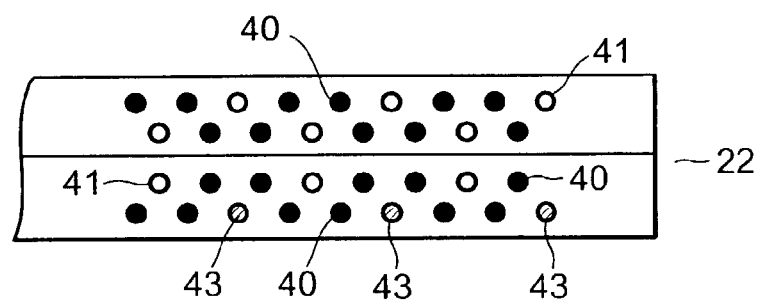
Figure 10C:
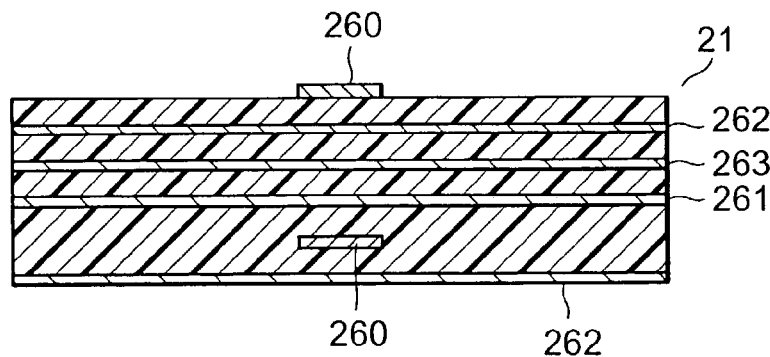

FIGS. 10A, 10B, and 10C are views showing an interconnection (wiring) structure and a pin arrangement of the connector of a semiconductor memory device according to a still further embodiment of this invention. FIG. 10A shows a multilayer interconnection structure of the mother board 20, FIG. 10B shows the pin arrangement of the connector 22, and FIG. 10C shows a multilayer interconnection structure of the memory module 21.

The illustrated mother board 20 has the multilayer interconnection structure of a four-layer and comprises the board bus interconnection layer 250 as a first layer, the board ground layer 252 as a second layer, the low frequency interconnection layer 253 as a third layer, and a board device power supply layer 254 as a fourth layer. In addition, in the manner which is similar to the above-mentioned embodiments, the board ground layer 252 disposed in the second layer may be disposed under the board bus interconnection layer 250 so as to overlap to the board bus interconnection layer 250 with each other and it is not necessary for the board ground layer 252 to dispose all over the second layer. In addition, other board interconnection layers such as the board bus interconnection layer or the like may be disposed in the third layer at a part except for the low frequency interconnection layer 253 disposed as the third layer. When the board bus interconnection layer is disposed as the third layer, the board bus interconnection layer in question is disposed so as to overlap with the board ground layer 252 as the second layer up and down and to oppose to each other. The board driver power supply layer may be disposed in the forth layer at a portion except for the board device power supply layer 254. When the bus interconnection layer is disposed as the third layer, the driver power supply layer is disposed so as to oppose to the bus interconnection layer in question.

Referring to FIG. 10C, the memory module 21 having the multilayer interconnection structure of a six layer is illustrated. The illustrated memory module 21 comprises, as a first layer, the module bus interconnection layer 260 in the manner as the mother board 20 and, as a second layer, the module ground layer 262. The module ground layer 262 is disposed so as to cover an area of the module bus interconnection layer 260. As a result, in the memory module 21, the module bus interconnection layer 260 and the module ground layer 262 are put into an opposite position relationship. Under the module ground layer 262, as third and fourth layers, the low frequency interconnection layer 263 and the module driver power supply layer 261 are disposed at its parts, respectively. Therefore, in the third layer, the device power supply layer or the like is disposed at a part except for the low frequency interconnection layer 263 while, in the forth layer, the low frequency interconnection layer or the like is disposed at a part except for the module driver power supply layer 261.

Furthermore, the illustrated memory module 21 further comprises, as a fifth layer, the module bus interconnection layer 260 and, as a sixth layer, the module ground layer 262. At a part except for the module bus interconnection layer 260 of the fifth layer, the device power supply layer is disposed. At a part of the fourth layer opposite to the part where the module bus interconnection layer 260 is disposed as the fifth layer, the module driver power supply layer is disposed. In addition, the module ground layer 262 of the sixth layer may be disposed at only a part opposite to the part where the module bus interconnection layer 260 is disposed as the fifth layer.

When the module bus interconnection layer 260 is disposed as the fifth layer in the illustrated multilayer interconnection structure, the module driver power supply layer 261 is disposed as the fourth layer at a position opposed to the module bus interconnection layer 260 in question. As a result, in the manner which is similar to other embodiments, when the module bus interconnection layer 260 and the module ground layer 262 are disposed as the fifth and the sixth layers, they are positioned so as to oppose to each other.

Referring now to FIG. 10B, the connector 22, which electrically connects the mother board 20 illustrated in FIG. 10A with the memory module 21 illustrated in FIG. 10C, is illustrated. The connector 22 illustrated in FIG. 10B comprises an upper two-rows pin arrangement and a lower two-rows pin arrangement. The upper two-rows pin arrangement and the lower two-rows pin arrangement are different from each other. That is, the upper two-rows pin arrangement comprises the high frequency interconnection pins 40 depicted at black circles and the ground pins 41 depicted at white circles. In the vicinity of the high frequency interconnection pin 40, the ground pin 41 is disposed as a pin except for other high frequency interconnection pins. As a result, in a part of the connector 22, a position relationship between the bus interconnection layer and the ground layer in the mother board 20 and the memory module 21 is held as it is.

On the other hand, in an upper row of the lower two-rows pin arrangement of FIG. 10B, the ground pin 41 depicted at a white circle is disposed adjacent to the high frequency interconnection pin 40 depicted at a block circle. In a lower row of the lower two-rows pin arrangement, the driver power supply pins 43 depicted at hatched circles and the high frequency interconnection pins 40 depicted at the black circles are disposed. In the example being illustrated, for two high frequency interconnection pins 40, one ground pin 41 or one driver power supply pin 43 is disposed. At any rate, in the lower two-rows pin arrangement of FIG. 10B, among pins adjacent to each high frequency interconnection pin 40, both of the ground pin 41 and the driver power supply pin 43 are disposed as pins except for the high frequency interconnection pins. With this pin arrangement, it is confirmed that it is possible to reduce disturbances in a waveform of a high frequency voltage supplied to the bus interconnection layer.

Figure 11:
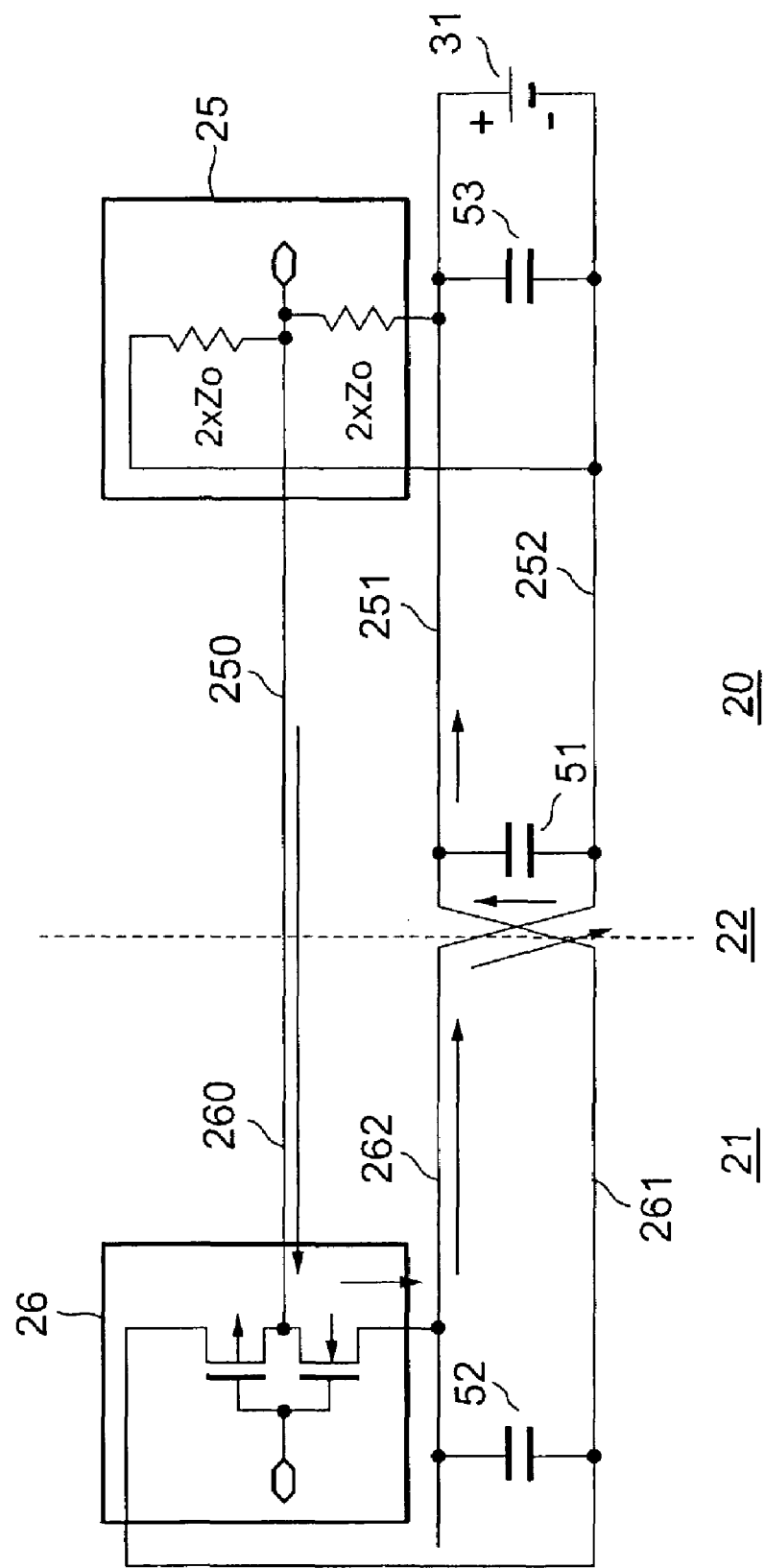
FIG. 11 is a view for use in describing a bus transmission system of a semiconductor memory device according to a further embodiment of this invention.

Referring to FIG. 11, a semiconductor memory device according to a yet further embodiment of this invention is illustrated. The semiconductor memory device illustrated in FIG. 11 is similar in structure to the conventional semiconductor memory device illustrated in FIG. 1 with a point where a plane position relationship between the module ground layer 262 and the module driver power supply layer 261 of the memory module 21 side and a plane position relationship between the board driver power supply layer 251 and the board ground layer 252 of the mother board 20 side are changed or switched. However, the semiconductor memory device illustrated in FIG. 11 is different from the semiconductor memory device illustrated in FIG. 1 with a point where a bypass capacitor 51 having a capacitance of 0.1 $\mu$F is disposed in the vicinity of a portion where the plane position relationships are switched. In the manner which is illustrated, the memory and the board bypass capacitors 52 and 53 are disposed in the vicinity of the memory device 26 of the memory module 21 side and in the vicinity of the memory controller 25 of the mother board 20 in the similar manner of FIG. 1.

By disposing the bypass capacitor 51 at the portion where the planes including the interconnection layers are switched as shown in FIG. 11, it is possible to stabilize a return current flowing through the ground layer and the driver power supply layer. As a result, it is possible to reduce disturbances in a waveform of a voltage supplied to a bus interconnection between the driver of the memory device 26 and the memory controller 25. The illustrated bypass capacitor 51 is disposed at a position on the mother board 20 near to the memory module 21 rather than the memory controller 25.

Figure 12:
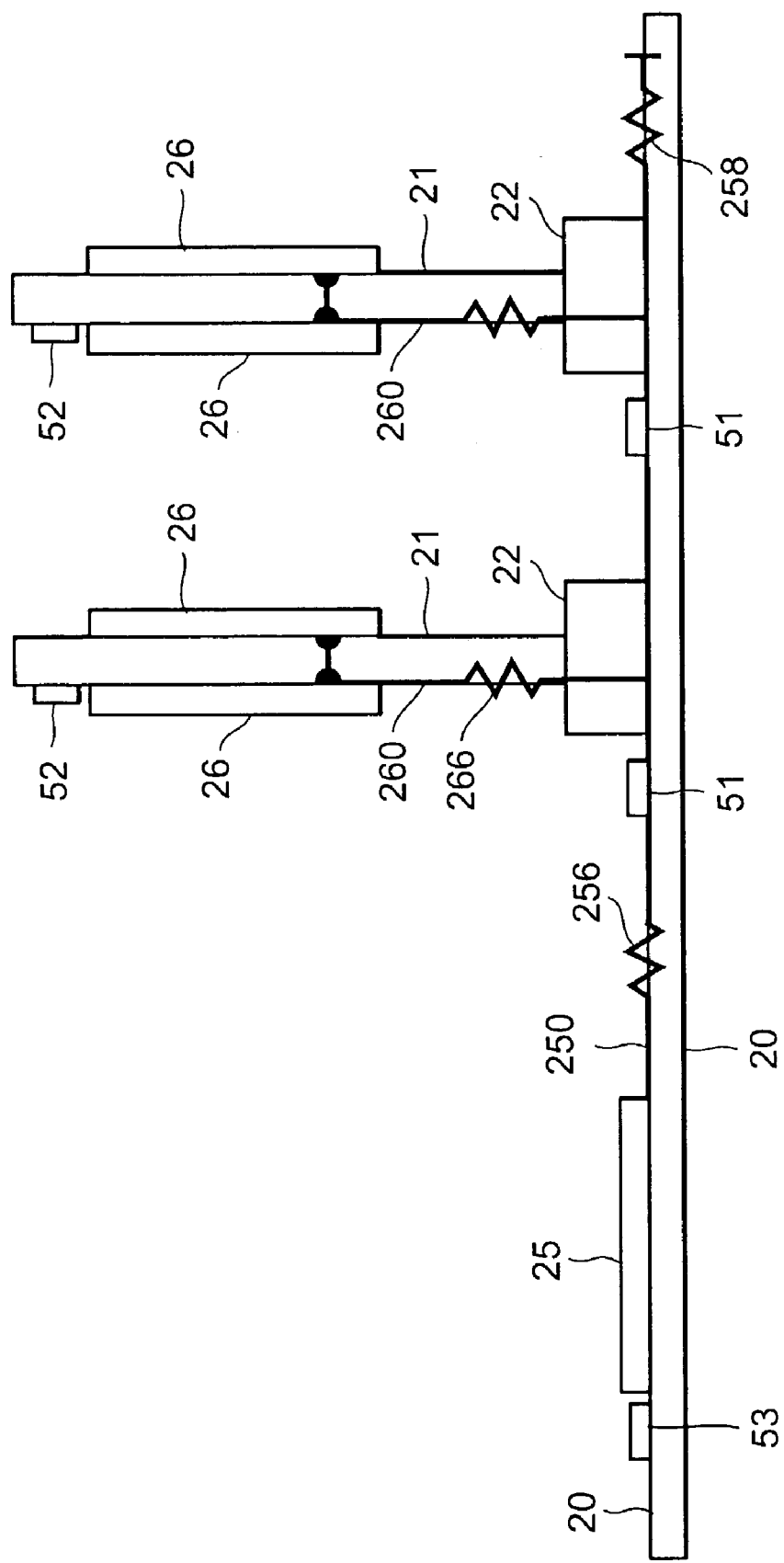
FIG. 12 is a view showing an example with substantial wiring in a case where the bus transmission system illustrated in FIG. 11 is concretely constituted.

Referring to FIG. 12, the semiconductor memory device illustrated in FIG. 11 is illustrated in a form of substantial interconnections. The illustrated semiconductor memory device adopts a bus transmission structure called SSTL (Stub Series Termination Logic). In FIG. 12, two memory modules 21 are mounted on the mother board 20 via connectors 22 and memory devices are mounted on two sides of each memory module 21, respectively. On the mother board 20, the memory controller 25 is mounted and the memory controller 25 is electrically connected to each memory device 26 of the memory module 21 through the board and the module bus interconnections 250 and 260. In FIG. 12, the ground layer, the driver power supply layer, and so on are omitted in order to simplify description.

The board bypass capacitor 53 is disposed in a position adjacent to the memory controller 25 of the mother board 20 while the memory bypass capacitor 52 is disposed in the vicinity of the memory device 26 of each memory module 21. The board bus interconnection layer 250 of the illustrated mother board 20 is connected to a stub resistor 256 while the module bus interconnection layer 260 of each memory module 21 is connected to a stub resistor 266. An end portion of the board bus interconnection layer 250 of the mother board 20 that is opposed to the memory controller 25 is terminated by a terminating resistor 258. In this connection, a reception portion of the memory controller 25 and the memory device 26 illustrated in FIG. 12 is not terminated.

In FIG. 12, each of the board and the module bus interconnection layers 250 and 260 in the mother board 20 and each memory module 21 has a characteristic impedance Zo of 54Ω, each of the stub resistors 256 and 266 has a resistance of 20Ω, and the terminating resistor 258 has a resistance of 27Ω. In addition, each of the bypass capacitors 51, 52, and 53 has a capacitance of 0.1 $\mu$F.

In the illustrated semiconductor memory device, the bypass capacitor 51 described with reference to FIG. 11 is connected to a position adjacent to each connector 22 in the board bus interconnection layer 250 on the mother board 20. Inasmuch as the bypass capacitor 51 is disposed in the vicinity of the connector 22 or in the vicinity of a switching position of the planes of the multilayer interconnection layers, it is possible to reduce degradation of a waveform of the voltage caused by disturbances of return current and to improve a signal quality in the manner which is described in conjunction with FIG. 11.

Figure 13:
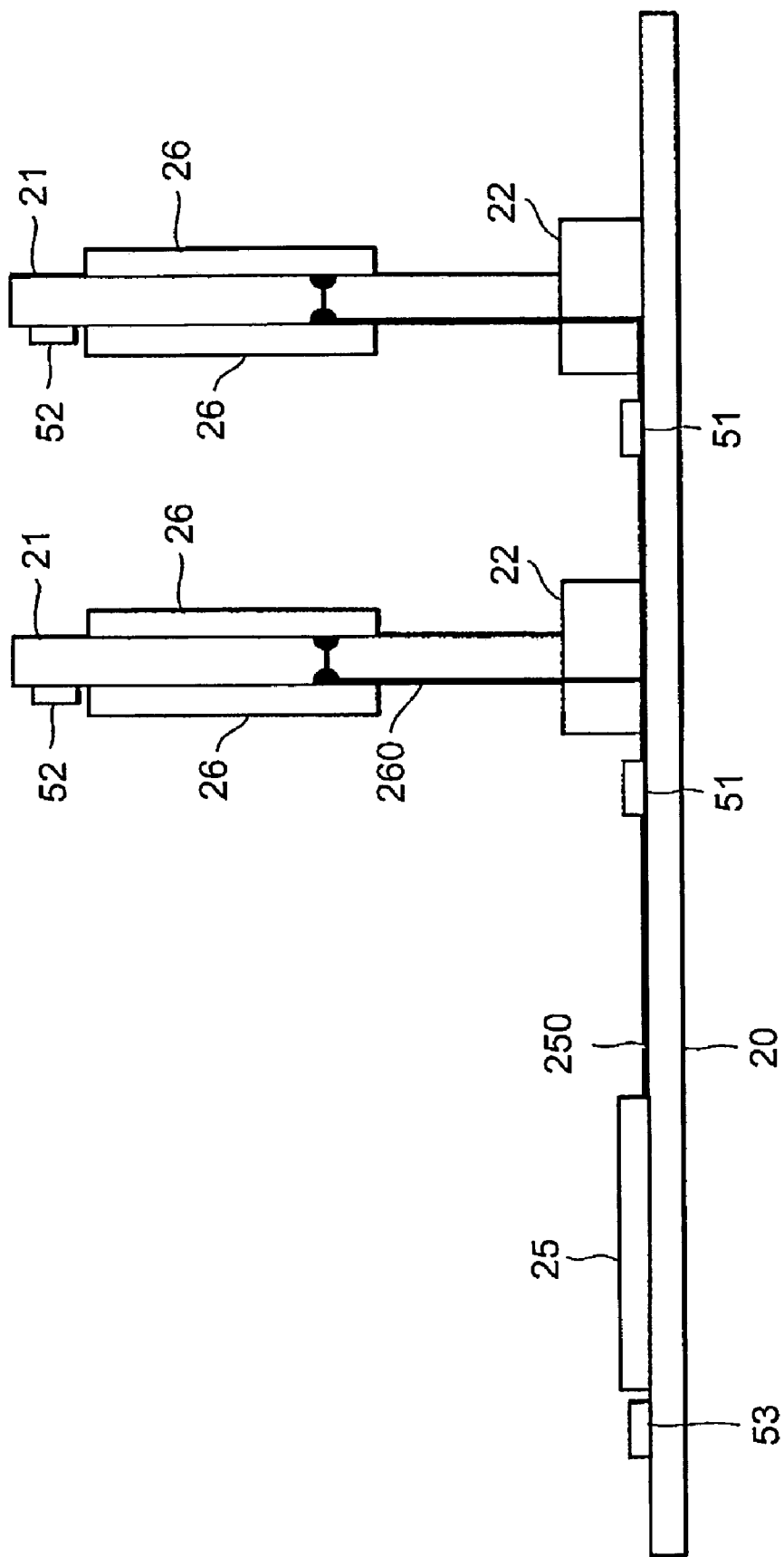
FIG. 13 is a view showing another constituted example of the bus transmission system illustrated in FIG. 11.

Referring to FIG. 13, a semiconductor memory device according to a still further embodiment of this invention is similar in structure to that illustrated in FIG. 12 except that the terminating resistor 258 illustrated in FIG. 12 is removed and the receiving end portions in the memory controller 25 and the memory device are terminated. Although the terminating resistor 258 is not disposed in a receiving end of the board bus interconnection layer 250 illustrated in FIG. 13, a similar effect in FIG. 12 is obtained. In this event, it is desirable that an active terminating for turning on/off in response to reading, writing, and so on is provided in the memory controller 25 and the memory devices 26.

The description will be directed to the bus transmission structure in FIG. 12 in more detailed. In the bus transmission structure where the reception end is not terminated, the return current locally flows in a portion directly under the bus interconnection layer of the conducive layer opposed to the bus interconnection layer in a high frequency which is more than hundreds of megahertz. Therefore, by disposing a plurality of bypass capacitors 51 between the bus interconnection layer and the conductive layer of the portion directly under the bus interconnection layer in question, it is understood that it is possible to ensure a path of the return current and it results in providing the waveform of the signal voltage from degrading.

While this invention has thus far been described in conjunction with several preferred embodiments thereof, it will now be readily possible for those skilled in the art to put this invention into various other manners. For example, although the description has been made with mentioning concrete numerical values in FIGS. 2, 5, and 12, it is clear that this invention is not restricted to them.

What is claimed is:

1. A memory device comprising:
   a memory module disposing a plurality of memories for inputting and outputting data therein, said memory module comprising a module multilayer interconnection layer including a module driver power supply layer, a module ground layer, and a module signal interconnection layer for transmitting a high frequency signal;
   a mother board for mounting said memory module by a connector therein, said mother board comprising a board multilayer interconnection layer including a board driver power supply layer, a board ground layer, and a board signal interconnection layer for transmitting a high frequency signal;
   a memory controller mounted on said mother board; and
   drivers mounted in said memories and said memory controller, each of said drivers having a push-pull structure, wherein
   a board position relationship between at least one of the board driver power supply layer and the board ground layer and the board signal interconnection layer in said board multilayer interconnection layer of said mother board is substantially held also in a module position relationship between at least one of the module driver power supply layer and the module ground layer and the module signal interconnection layer in said module multilayer interconnection layer of said memory module, thereby reducing disturbances of a return current flowing in said board and said module driver power supply layers and in said board and said module ground layers and degradation of the high frequency signal.

2. A memory device as claimed in claim 1, wherein said board position relationship and said module position relationship are opposite to each other in said board and said module multilayer interconnection layers.

3. A memory device as claimed in claim 1, wherein both of said board and said module driver power supply layers and said board and said module ground layers are put into a predetermined position relationship for said board and said module signal interconnection layers in both of said board and said module multilayer interconnection layers of said mother board and said memory module.

4. A memory device as claimed in claim 2, wherein both of said board and said module driver power supply layers and said board and said module ground layers are put into a predetermined position relationship for said board and said module signal interconnection layers in both of said board and said module multilayer interconnection layers of said mother board and said memory module.

5. A memory device as claimed in claim 1, wherein each of said board and said module signal interconnection layers includes at least one of a reference clock interconnection for transmitting a high frequency signal, a data interconnection, and a signal interconnection for transmitting a high frequency signal equivalent to a reference clock signal and data.

6. A memory device as claimed in claim 2, wherein each of said board and said module signal interconnection layers includes at least one of a reference clock interconnection for transmitting a high frequency signal, a data interconnection, and a signal interconnection for transmitting a high frequency signal equivalent to a reference clock signal and data.

7. A memory device as claimed in claim 3, wherein each of said board and said module signal interconnection layers includes at least one of a reference clock interconnection for transmitting a high frequency signal, a data interconnection, and a signal interconnection for transmitting a high frequency signal equivalent to a reference clock signal and data.

8. A memory device as claimed in claim 4, wherein each of said board and said module signal interconnection layers includes at least one of a reference clock interconnection for transmitting a high frequency signal, a data interconnection, and a signal interconnection for transmitting a high frequency signal equivalent to a reference clock signal and data.

9. A memory device as claimed in claim 3, wherein said connector comprises ground pins electrically connected to ground interconnections of said board and said module ground layers, driver power supply pins electrically connected to power supply interconnections of said board and said module driver power supply layers, and a plurality of high frequency signal pins electrically connected to signal interconnections of said board and said module signal interconnection layers, said ground pins being disposed in the vicinity of periphery of said high frequency signal pins.

10. A memory device as claimed in claim 3, wherein said connector comprises ground pins electrically connected to ground interconnections of said board and said module ground layers, driver power supply pins electrically connected to power supply interconnections of said board and said module driver power supply layers, and a plurality of high frequency signal pins electrically connected to signal interconnections of said board and said module signal interconnection layer, said driver power supply pins being disposed in the vicinity of said high frequency signal pins.

11. A memory device as claimed in claim 3, wherein said connector comprises ground pins electrically connected to ground interconnections of said board and said module ground layers, driver power supply pins electrically connected to power supply interconnections of said board and said module driver power supply layers, and a plurality of high frequency signal pins electrically connected to signal interconnections of said board and said module signal interconnection layers, said connector including two pins in the vicinity of one of said high frequency signal pins, one of said two pins being the ground pin, another of said two pins being the driver power supply pin.

12. A memory device as claimed in claim 4, wherein said connector comprises ground pins electrically connected to ground interconnections of said board and said module ground layers, driver power supply pins electrically connected to power supply interconnections of said board and said module driver power supply layers, and a plurality of high frequency signal pins electrically connected to signal interconnections of said board and said module signal interconnection layers, said ground pins being disposed in the vicinity of periphery of said high frequency signal pins.

13. A memory device as claimed in claim 4, wherein said connector comprises ground pins electrically connected to ground interconnections of said board and said module ground layers, driver power supply pins electrically connected to power supply interconnections of said board and said module driver power supply layers, and a plurality of high frequency signal pins electrically connected to signal interconnections of said board and said module signal interconnection layer, said driver power supply pins being disposed in the vicinity of said high frequency signal pins.

14. A memory device as claimed in claim 4, wherein said connector comprises ground pins electrically connected to ground interconnections of said board and said module ground layers, driver power supply pins electrically connected to power supply interconnections of said board and said module driver power supply layers, and a plurality of high frequency signal pins electrically connected to signal interconnections of said board and said module signal interconnection layers, said connector including two pins in the vicinity of one of said high frequency signal pins, one of said two pins being the ground pin, another of said two pins being the driver power supply pin.

15. A memory bus transmission system comprising:
a plurality of memories in which data are inputted and outputted;
a plurality of memory modules on which said memories are disposed;
a memory controller for controlling said plurality of memories; a mother board on which said memory controller is disposed;
drivers mounted in said memories and said memory controller, each of said drivers having a push-pull structure; and
a plurality of signal interconnections for electrically connecting said memory controller and said memories, said signal interconnections including a plurality of high frequency signal interconnections operating at a high frequency, a driver power supply layer, and a ground layer, said high frequency signal interconnections being put into an opposite position relationship to at least one of said driver power supply layer and said ground layer at a section of said mother board and said memory module, said opposite position relationship being substantially identical at the section of said mother board and said memory module.

16. A memory bus transmission system as claimed in claim 15, wherein said high frequency signal interconnections are substantially wired at a section of said mother board and said memory module so as to oppose to said ground layer in said driver power supply layer and said ground layer, a ground interconnection being wired in a section of said connector so as to oppose to said high frequency signal interconnections.

17. A memory bus transmission system as claimed in claim 15, wherein said high frequency signal interconnections are substantially wired at a section of said mother board and said memory module so as to oppose to both of said ground layer and said driver power supply layer, an opposite relationship between said high frequency signal interconnections and each of said ground layer and said driver power supply layer being substantially held at a section of said mother board and said memory module, said high frequency signal interconnections being opposite to said ground layer and said driver power supply layer at a section of said connector.

18. A memory bus transmission system as claimed in claim 15, wherein a part of said high frequency signal interconnections is substantially wired at a section of said mother board and said memory module so as to oppose to said ground layer, a part of said high frequency signal interconnections being opposite to said ground layer at a section of said connector, the remainder of said high frequency signal interconnections being opposite to said ground layer and said driver power supply layer at the section of said connector.

19. A memory bus transmission system as claimed in claim 15, wherein a part of said high frequency signal interconnections is substantially wired at a section of said mother board and said memory module so as to oppose to said ground layer, the remaining of said high frequency signal interconnections being substantially wired at the section of said mother board and said memory module so as to oppose to both of said ground layer and said driver power supply layer, a part of said high frequency signal interconnections being opposite to said ground layer at a section of said connector, the remaining of said high frequency signal interconnections being opposite to said ground layer and said driver power supply layer at the section of said connector.

20. A memory bus transmission system comprises:
a memory module disposing a plurality of memories thereon that date are inputted and outputted;
a mother board mounting a memory controller for controlling said plurality of memories thereon;
a connector for electrically connecting said memory module and said mother board; drivers mounted in said memories and said memory controller, each of said drivers having a push-pull structure;
a bus interconnection layer for connecting said driver and said memory controller; and
a bypass capacitor disposed on said mother board adjacent to said connector at a predetermined position, thereby bypassing a return current from said bus interconnection layer by said bypass capacitor.

21. A memory bus transmission system as claimed in claim 20, wherein the predetermined position of said bypass capacitor is disposed in the vicinity of a position where said bus interconnection layer switches to another layer at a multilayer interconnection layer in said mother board and said memory module.

22. A memory bus transmission system as claimed in claim 20, wherein said mother board comprises a multilayer interconnection layer including a driver power supply layer and a ground layer, said memory bus transmission system further comprising another bypass capacitor which is electrically connected to said driver power supply layer and said ground layer in the vicinity of said memory controller.

23. A memory bus transmission system as claimed in claim 21, wherein said mother board including, as said multilayer interconnection layer, a driver power supply layer and a ground layer, said memory bus transmission system further comprising another bypass capacitor which is electrically connected to said driver power supply layer and said ground layer in the vicinity of said memory controller.

24. A memory module for mounting a plurality of memories on both surfaces that input and output data, said memory module comprising a multilayer interconnection structure, wherein said memory module comprises:
a first high frequency interconnection layer for said memories disposed at a side of one surface of said both surfaces;
a ground layer, opposite to said first high frequency interconnection layer, disposed at a side of one surface of said both surfaces;
a second high frequency interconnection layer for said memories disposed at a side of another surface of said both surfaces; and
a power supply layer, opposite to said second high frequency interconnection layer, disposed at a side of another surface of said both surfaces.

25. A memory module as claimed in claim 24, wherein said first and said second high frequency interconnection layers are disposed on one and another surfaces of said memory module, said ground layer and said power supply layer being disposed within said memory module.

* * * * *